United States Patent
Shimizu

(10) Patent No.: US 10,580,874 B2
(45) Date of Patent: Mar. 3, 2020

(54) SEMICONDUCTOR DEVICE WITH SILICON OXIDE LAYER HAVING ELEMENT DOUBLE BONDED TO OXYGEN, SEMICONDUCTOR DEVICE MANUFACTURING METHOD, INVERTER CIRCUIT, DRIVING DEVICE, VEHICLE, AND ELEVATOR

(71) Applicant: Kabushiki Kaisha Toshiba, Minato-ku (JP)

(72) Inventor: Tatsuo Shimizu, Shinagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 19 days.

(21) Appl. No.: 15/695,597

(22) Filed: Sep. 5, 2017

(65) Prior Publication Data

US 2018/0226474 A1 Aug. 9, 2018

(30) Foreign Application Priority Data

Feb. 9, 2017 (JP) ................................. 2017-021945

(51) Int. Cl.
*H01L 51/05* (2006.01)
*H01L 29/40* (2006.01)
(Continued)

(52) U.S. Cl.
CPC .......... *H01L 29/408* (2013.01); *B60L 15/007* (2013.01); *H01L 21/046* (2013.01);
(Continued)

(58) Field of Classification Search
CPC ............. H01L 29/408; H01L 29/66068; H01L 21/046; H01L 29/1608; H01L 21/049;
(Continued)

(56) References Cited

U.S. PATENT DOCUMENTS 3,497,773 A * 2/1970 Harding .................. H01L 21/00
257/537
5,094,978 A * 3/1992 Miyagaki ............ H01L 31/1884
438/609

(Continued)

FOREIGN PATENT DOCUMENTS

JP 2016-181671 10/1916
JP 05-347298 12/1993
(Continued)

OTHER PUBLICATIONS

Vasil'ev, V.Y. Glass Phys Chem (2000) 26: 83. https://doi.org/10.1007/BF02731948 (Year: 2000).*
(Continued)

*Primary Examiner* — Jarrett J Stark
(74) *Attorney, Agent, or Firm* — Oblon, McClelland, Maier & Neustadt, L.L.P.

(57) ABSTRACT

A semiconductor device according to the embodiments described herein includes a silicon carbide layer and a silicon oxide layer. The silicon oxide layer is disposed on the silicon carbide layer and contains at least one element selected from a group of phosphorus (P), arsenic (As), antimony (Sb), and bismuth (Bi). In the silicon oxide layer, at least a part of the at least one element is single bonded to three oxygen atoms and double bonded to one oxygen atom.

16 Claims, 13 Drawing Sheets

(51) Int. Cl.
*H01L 29/16* (2006.01)
*H01L 29/10* (2006.01)
*H01L 29/78* (2006.01)
*H01L 29/66* (2006.01)
*H01L 21/04* (2006.01)
*B60L 15/00* (2006.01)
*B66B 11/04* (2006.01)
*H02P 27/06* (2006.01)
*H02M 7/537* (2006.01)
*B61C 17/00* (2006.01)
*B61C 3/00* (2006.01)

(52) U.S. Cl.
CPC ........ H01L 21/049 (2013.01); H01L 29/1095 (2013.01); H01L 29/1608 (2013.01); H01L 29/66068 (2013.01); H01L 29/7802 (2013.01); *H01L 51/0525* (2013.01); *B61C 3/00* (2013.01); *B61C 17/00* (2013.01); *B66B 11/043* (2013.01); *H02M 7/537* (2013.01); *H02P 27/06* (2013.01)

(58) Field of Classification Search
CPC ............. H01L 29/7802; H01L 29/1095; H01L 23/5329–53295; H01L 21/76801–76837; H01L 21/3115–31155; B66B 11/043; B61C 17/00; B61C 3/00; H02P 27/06; B60L 11/1803; B60L 15/007; H02M 7/537

See application file for complete search history.

(56) References Cited

U.S. PATENT DOCUMENTS

| | | | | |
|---|---|---|---|---|
| 5,259,925 A * | 11/1993 | Herrick | .................... | H01L 21/78 148/DIG. 131 |
| 7,572,708 B1 * | 8/2009 | Babcock | ............. | H01L 29/0804 257/E21.149 |
| 7,821,056 B2 * | 10/2010 | Akahori | ............ | H01L 21/32115 257/321 |
| 8,043,871 B2 * | 10/2011 | Ohtsuki | ............ | H01L 21/02238 438/16 |
| 9,758,368 B2 * | 9/2017 | Gogoi | ........................ | B81B 7/02 |
| 9,862,594 B2 * | 1/2018 | Gogoi | ........................ | B81B 7/02 |
| 9,890,038 B2 * | 2/2018 | Gogoi | ........................ | B81B 7/02 |
| 2004/0183202 A1 * | 9/2004 | Usami | ............... | H01L 23/53238 257/762 |
| 2007/0022827 A1 * | 2/2007 | Ishikawa | ............ | G01C 19/5719 73/862.12 |
| 2008/0173984 A1 * | 7/2008 | Lin | ..................... | H01L 21/3105 257/639 |
| 2011/0049594 A1 * | 3/2011 | Dyer | ................. | H01L 21/76254 257/296 |
| 2012/0241767 A1 * | 9/2012 | Yano | ..................... | H01L 21/049 257/77 |
| 2014/0077227 A1 * | 3/2014 | Williams | ............... | H01L 29/513 257/77 |
| 2014/0264382 A1 * | 9/2014 | MacMillan | ......... | H01L 29/1608 257/77 |
| 2016/0097731 A1 * | 4/2016 | Usagawa | ............... | G01N 27/12 73/31.06 |
| 2016/0126092 A1 | 5/2016 | Makifuchi et al. | | |
| 2016/0276152 A1 * | 9/2016 | Tachibana | ............... | C09D 183/04 |
| 2017/0018615 A1 * | 1/2017 | Harada | ............... | H01L 21/0485 |
| 2017/0323943 A1 * | 11/2017 | Peng | ............... | H01L 21/823412 |
| 2018/0083112 A1 | 3/2018 | Shimizu et al. | | |
| 2018/0099868 A1 * | 4/2018 | Gogoi | ........................ | B81B 7/02 |

FOREIGN PATENT DOCUMENTS

| | | |
|---|---|---|
| JP | 2000-183152 | 6/2000 |
| JP | 3267257 B2 | 3/2002 |
| JP | 2005-136386 | 5/2005 |
| JP | 2008-243919 | 10/2008 |
| JP | 5610492 B2 | 10/2014 |
| JP | 2018-46246 A | 3/2018 |
| WO | WO2011/074237 | 6/2011 |
| WO | WO2015/005397 | 1/2015 |

OTHER PUBLICATIONS

Ketterer, Juergen & Kramer, V. (1986). Crystal structure of the bismuth silicate Bi2SiO5 . . . Neues Jahrbuch fur Mineralogie, Monatshefte. 13-18.) (Year: 1986).*

* cited by examiner

US 10,580,874 B2

SEMICONDUCTOR DEVICE WITH SILICON OXIDE LAYER HAVING ELEMENT DOUBLE BONDED TO OXYGEN, SEMICONDUCTOR DEVICE MANUFACTURING METHOD, INVERTER CIRCUIT, DRIVING DEVICE, VEHICLE, AND ELEVATOR

CROSS-REFERENCE TO RELATED APPLICATION

This application is based upon and claims the benefit of priority from Japanese Patent Application No. 2017-021945, filed on Feb. 9, 2017, the entire contents of which are incorporated herein by reference.

FIELD

Embodiments described herein relate generally to a semiconductor device, a semiconductor device manufacturing method, an inverter circuit, a driving device, a vehicle, and an elevator.

BACKGROUND

Silicon carbide (SiC) is expected to serve as a material for a next-generation semiconductor device. SiC has more excellent physical properties in comparison with silicon (Si): band gap, three times; breakdown field strength, approximately ten times; and thermal conductivity, approximately three times. A low loss semiconductor device which can operate at a high temperature can be realized by using such properties.

However, when a metal oxide semiconductor field effect transistor (MOSFET) is formed by using SiC, for example, there is a problem that carrier mobility is lowered. It is considered that a decrease in carrier mobility is due to a high density of an interface state existing between a silicon carbide layer and a silicon oxide layer functioning as a gate insulating layer.

DETAILED DESCRIPTION

Figure 1:
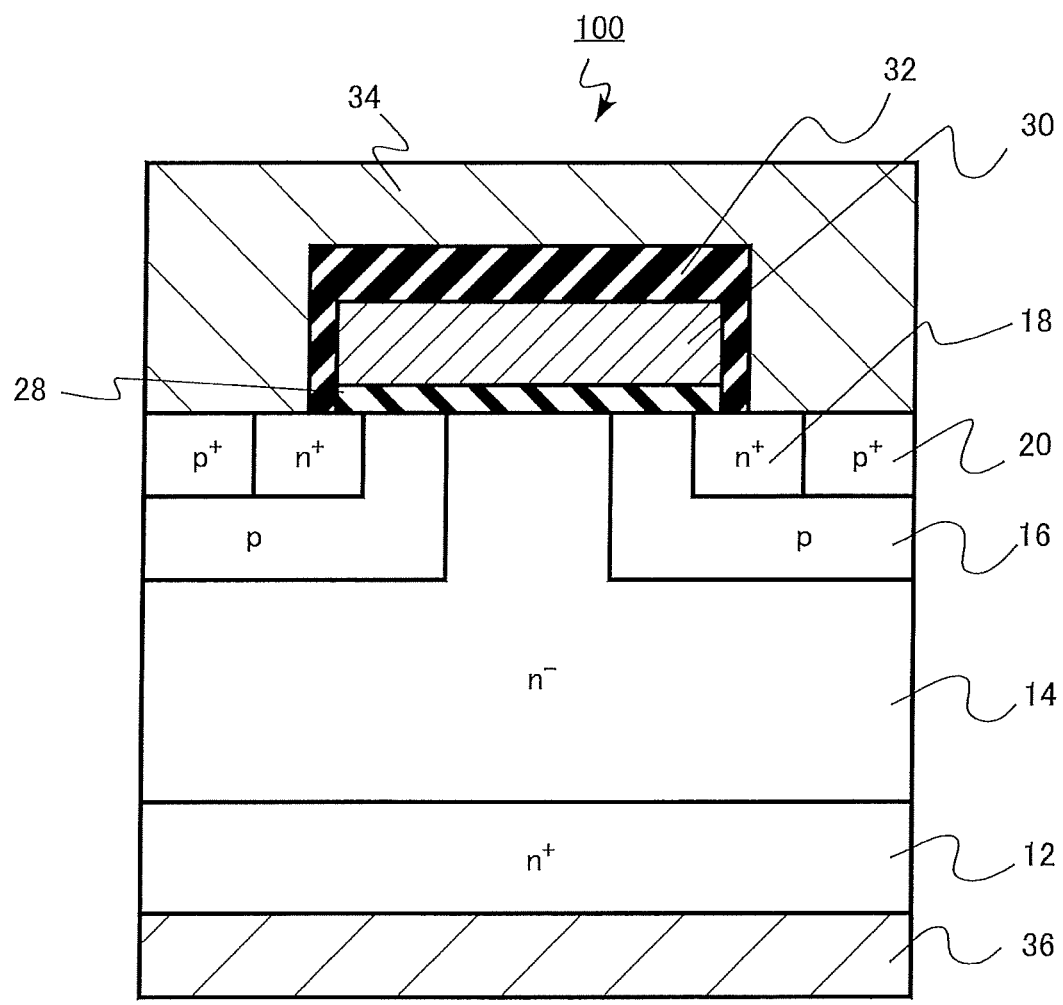
FIG. 1 is a schematic sectional view of a semiconductor device according to a first embodiment.

A semiconductor device according to the embodiments described herein includes a silicon carbide layer, and a silicon oxide layer disposed on the silicon carbide layer, the silicon oxide layer containing at least one element selected from the group consisting of phosphorus (P), arsenic (As), antimony (Sb), and bismuth (Bi), at least a part of the at least one element being single bonded to three oxygen atoms and double bonded to one oxygen atom.

Embodiments of the present disclosure will be described below with reference to drawings. In description below, same members or similar members will be denoted by same reference characters, and description of members already described will be appropriately omitted.

Further, in description below, symbols of $n^+$, n, $n^-$ and $p^+$, p, $p^-$ indicate relative height of an impurity concentration in each conduction type. Specifically, $n^+$ indicates that an impurity concentration of an n-type is relatively higher than n, and $n^-$ indicates that the impurity concentration of the n-type is relatively lower than n. Furthermore, $p^+$ indicates that an impurity concentration of a p-type is relatively higher than p, and $p^-$ indicates that the impurity concentration of the p-type is relatively lower than p. An $n^+$-type and an $n^-$-type may be simply written as an n-type, and a $p^+$-type and a $p^-$-type may be simply written as a p-type.

First Embodiment

A semiconductor device according to a first embodiment includes a silicon carbide layer and a silicon oxide layer. The silicon oxide layer is disposed on the silicon carbide layer and includes at least one element selected from a group of phosphorus (P), arsenic (As), antimony (Sb), and bismuth (Bi). In the silicon oxide layer, at least a part of the at least one element is single bonded to three oxygen atoms and double bonded to one oxygen atom.

FIG. 1 is a schematic sectional view illustrating a MOSFET which is a semiconductor device according to the present embodiment. A MOSFET 100 is a double implantation MOSFET (DIMOSFET) in which a p-well and a source region are formed by ion implantation. Further, the MOSFET 100 is an n-channel type MOSFET in which an electron is a carrier.

The MOSFET 100 includes a silicon carbide substrate 12, a drift layer 14 (silicon carbide layer), a p-well region 16 (silicon carbide layer), a source region 18, a p-well contact region 20, a silicon oxide layer 28, a gate electrode 30, an interlayer insulating film 32, a source electrode 34, and a drain electrode 36.

The silicon carbide substrate 12 is, for example, an $n^+$-type 4H—SiC substrate. The silicon carbide substrate 12 is, for example, contains nitrogen (N) as an n-type impurity. An impurity concentration of an n-type impurity of the silicon carbide substrate 12 is, for example, $1\times10^{18}$ $cm^{-3}$ or more and $1\times10^{20}$ $cm^{-3}$ or less.

A surface of the silicon carbide substrate 12 is, for example, a surface inclined by 0° or more to 8° or less with respect to a (0001) face. The (0001) face is called a silicon face. A back surface of the silicon carbide substrate 12 is, for example, a surface inclined at 0° or more to 8° to less with respect to a (000-1) face. The (000-1) face is called a carbon face.

The drift layer 14 is provided on a surface of the silicon carbide substrate 12. The drift layer 14 is an n-type silicon carbide layer. The drift layer 14, for example, contains nitrogen as an n-type impurity.

A concentration of the n-type impurity in the drift layer 14 is, for example, $5 \times 10^{15}$ cm$^{-3}$ or more and $2 \times 10^{16}$ cm$^{-3}$ or less. The drift layer 14 is, for example, an epitaxial layer of SiC formed on the silicon carbide substrate 12 by epitaxial growing.

A front face of the drift layer 14 is a surface inclined at 0° or more and 8° or less with respect to a silicon face. A thickness of the drift layer 14 is, for example, 5 μm or more and 100 μm or less.

The p-well region 16 is provided on a part of a surface of the drift layer 14. The p-well region 16 is a p-type silicon carbide region. The p-well region 16, for example, contains aluminum (Al) as a p-type impurity. A concentration of the p-type impurity in the p-well region 16 is, for example, $5 \times 10^{15}$ cm$^{-3}$ or more and $1 \times 10^{17}$ cm$^{-3}$ or less.

The depth of the p-well region 16 is, for example, 0.4 μm or more and 0.8 μm or less. The p-well region 16 functions as a channel region of the MOSFET 100.

A surface of the P-well region 16 is a surface inclined at 0° or more and 8° or less with respect to a silicon face.

The source region 18 is provided on a part of the surface of the p-well region 16. The source region 18 is an n$^+$-type silicon carbide layer. The source region 18, for example, contains phosphorus (P) as an n-type impurity. A concentration of the n-type impurity in the source region 18 is, for example, $1 \times 10^{18}$ cm$^{-3}$ or more and $1 \times 10^{22}$ cm$^{-3}$ or less.

The depth of the source region 18 is shallower than the depth of the p-well region 16. The depth of the source region 18 is, for example, 0.2 μm or more and 0.4 μm or less.

The p-well contact region 20 is provided on a part of the surface of the p-well region 16. The p-well contact region 20 is provided on a side of the source region 18. The p-well contact region 20 is a p$^+$-type silicon carbide region.

The p-well contact region 20, for example, contains aluminum (Al) as a p-type impurity. A concentration of the p-type impurity in the p-well contact region 20 is, for example, $1 \times 10^{18}$ cm$^{-3}$ or more and $1 \times 10^{22}$ cm$^{-3}$ or less.

The depth of the p-well contact region 20 is shallower than the depth of the p-well region 16. The depth of the p-well contact region 20 is, for example, 0.2 μm or more and 0.4 μm or less.

The silicon oxide layer 28 is provided on the drift layer 14 and the p-well region 16. The silicon oxide layer 28 is provided between the p-well region 16 and the gate electrode 30. The silicon oxide layer 28 is continuously formed on surfaces of the drift layer 14 and the p-well region 16.

A thickness of the silicon oxide layer 28 is, for example, 10 nm or more and 100 nm or less. The silicon oxide layer 28 functions as a gate insulating layer of the MOSFET 100.

The silicon oxide layer 28 contains at least one element selected from the group of phosphorus (P), arsenic (As), antimony (Sb), and bismuth (Bi). Hereinafter, this element is called a termination element. At least a part of the termination elements in the silicon oxide layer 28 is single bonded to three oxygen atoms and double bonded to one oxygen atom.

The silicon oxide layer 28 may contain inevitable impurities other than the termination elements.

Figure 2A:
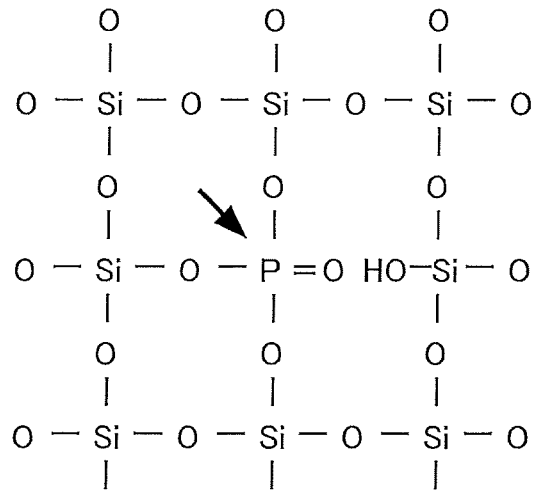
FIGS. 2A, 2B and 2C are explanatory diagrams of a silicon oxide layer according to the first embodiment.
Figure 2B:
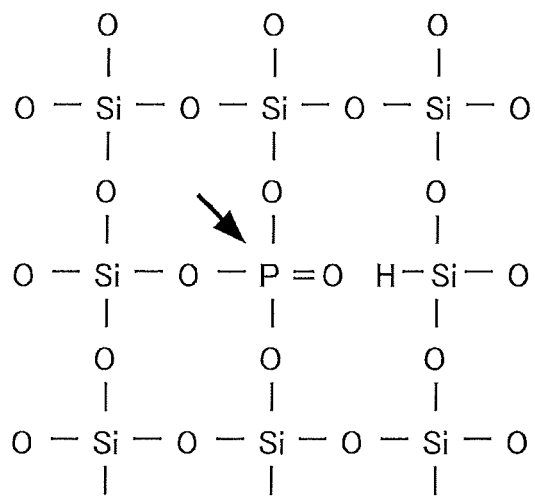
Figure 2C:
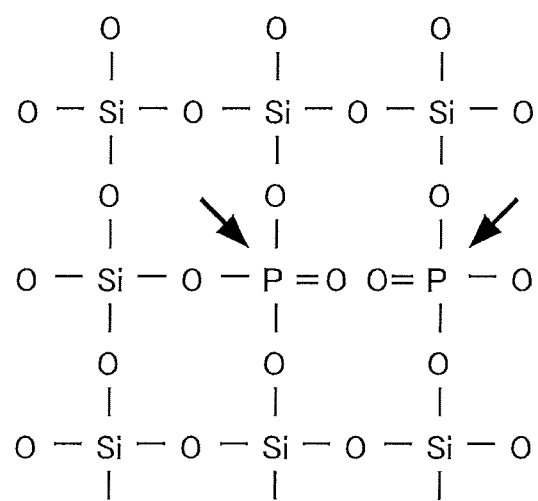

FIGS. 2A, 2B and 2C are explanatory diagrams of the silicon oxide layer 28 according to the embodiment. FIGS. 2A, 2B and 2C are diagrams illustrating a bonding state of the termination elements in the silicon oxide layer 28. FIGS. 2A, 2B and 2C indicate the case where the termination elements are phosphorus (P).

At least a part of phosphorus (P) in the silicon oxide layer 28 is single bonded to three oxygen atoms and double bonded to one oxygen atom as indicated by arrows in FIGS. 2A, 2B, and 2C.

FIG. 2A indicates a structure in which phosphorus double bonded to oxygen and a silicon atom bonded a hydroxyl group form a pair. In addition, FIG. 2B indicates a structure in which phosphorus double bonded to oxygen and silicon bonded to hydrogen form a pair. In addition, FIG. 2C indicates a structure in which phosphorus double bonded to oxygen and phosphorus double bonded to oxygen form a pair.

Instead of hydrogen indicated in FIG. 2B, phosphorus double bonded to oxygen and silicon bonded to fluorine (F) may form a pair.

For example, in the termination elements, a proportion occupied by the termination elements single bonded to three oxygen atoms and double bonded to one oxygen atom is larger than a proportion occupied by the termination elements single bonded to four oxygen atoms. For example, in the termination elements, a proportion occupied by the termination elements single bonded to three oxygen atoms and double bonded to one oxygen atom is 10 times or more of a proportion occupied by the termination elements single bonded to four oxygen atoms. For example, in the termination elements, a proportion occupied by the termination elements single bonded to three oxygen atoms and double bonded to one oxygen atom is 90% or more.

Whether or not there is a termination element single bonded to three oxygen atoms and double bonded to one oxygen atom in the silicon oxide layer 28 can be confirmed by, for example, X-ray photoelectron spectroscopy (XPS).

In the termination elements, a proportion occupied by the termination elements single bonded to three oxygen atoms and double bonded to one oxygen atom, a proportion occupied by the termination elements single bonded to four oxygen atoms, and a magnitude relation thereof can be, for example, determined by comparing a count number of photoelectrons attributed to the termination elements single bonded to three oxygen atoms and double bonded to one oxygen atom and a count number of photoelectrons attributed to the termination elements single bonded to four oxygen atoms, for example, by XPS.

Figure 3:
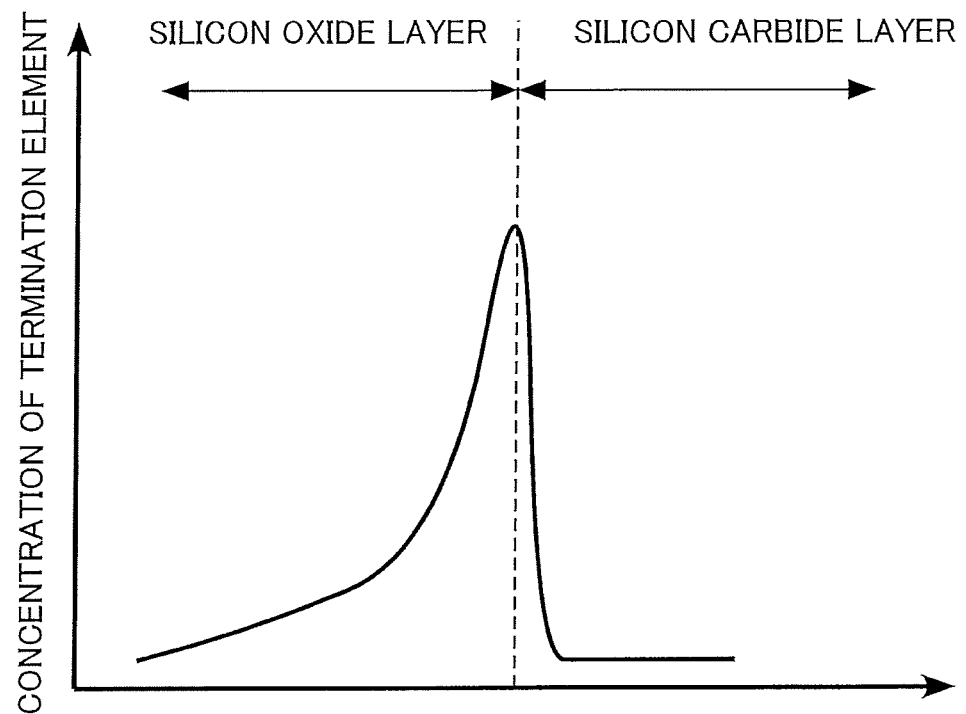
FIG. 3 is a drawing indicating an example of a concentration distribution of termination elements according to the first embodiment.

FIG. 3 is a drawing indicating an example of a concentration distribution of the termination elements according to the embodiment.

The termination elements segregate on an interface between the drift layer 14 (silicon carbide layer) and the p-well region 16 (silicon carbide layer) and the silicon oxide layer 28. A peak of the concentration distribution of the termination elements exists near the interface. The concentration of the termination elements in the silicon oxide layer 28 decreases, for example, as the termination elements are further away from the interface. The concentration of the termination elements in the silicon oxide layer 28 may be, for example, substantially the same concentration as the interface over the entire layer. However, it is necessary to process a thick film to make the concentration of the termination elements in the silicon oxide layer 28 substantially the same as the interface over the entire layer. Therefore, considerable costs (especially long time, occasionally temperature rising) for such as ozone treatment is required. At that time, a possibility that the interface is oxidized increases. Therefore, it is preferable to use a structure that requires processing near the interface.

The termination elements substitute the uppermost silicon or carbon of the drift layer 14 and the p-well region 16. Since uppermost atoms are substituted, the termination element is triple-coordinated with a silicon carbide layer. In other words, the termination element is positioned at silicon or carbon position in a crystal lattice of silicon carbide. In other words, the termination element is triple-coordinated with carbon of the silicon carbide layer, or with silicon of the silicon carbide layer.

A concentration of the termination elements in the silicon oxide layer 28 is, for example, $1 \times 10^{18}$ cm$^{-3}$ or more and $5 \times 10^{21}$ cm$^{-3}$ or less.

Concentrations and distributions of the termination elements and other elements in the silicon oxide layer 28 can be measured by, for example, secondary ion mass spectroscopy (SIMS).

The silicon oxide layer 28 contains, for example, hydrogen. When the termination element has the structure indicated in FIGS. 2A and 2B, the silicon oxide layer 28 contains hydrogen. A concentration of the hydrogen is, for example, 80% or more and 120% or less of a concentration of the termination element.

A distribution of the hydrogen in the thickness direction in the silicon oxide layer 28 substantially coincides with a distribution of the termination element. The concentration and distribution in the thickness direction of hydrogen in the silicon oxide layer 28 can be measured by, for example, SIMS.

For example, a concentration of hydrogen at a first position in the silicon oxide layer 28 is 80% or more and 120% or less of the termination element at the first position. For example, the first position is positioned within a region excluding 10% of a layer thickness from both end portions in the layer thickness direction of the silicon oxide layer 28.

The gate electrode 30 is provided on the silicon oxide layer 28. The silicon oxide layer 28 is provided between the gate electrode 30 and the drift layer 14/the p-well region 16.

For the gate electrode 30, for example, polycrystalline silicon containing an n-type impurity or a p-type impurity can be used.

The interlayer insulating film 32 is formed on the gate electrode 30. The interlayer insulating film 32 is, for example, a silicon oxide film.

A source electrode 34 is electrically connected to the source region 18 and the p-well contact region 20. The source electrode 34 functions as a p-well electrode which applies a potential to the p-well region 16.

The source electrode 34 is formed by lamination of, for example, barrier metal layers of nickel (Ni) and metal layers of aluminum on the barrier metal layers. The barrier metal layer of Ni and the silicon carbide layer may react to form nickel silicide (such as NiSi and Ni$_2$Si). The barrier metal layer of Ni and the metal layer of aluminum may form an alloy by reaction.

The drain electrode 36 is provided on a side opposite to the drift layer 14 of the silicon carbide substrate 12, that is, on a back surface side. The drain electrode 36 is, for example, Ni. Ni may react with the silicon carbide substrate 12 to form nickel silicide.

In the embodiment, the n-type impurity is, for example, nitrogen or phosphorus. It is also possible to use arsenic (As) or antimony (Sb) as the n-type impurity.

Further, in the embodiment, the p-type impurity is, for example, Al. Boron (B), gallium (Ga), and indium (In) can also be used as the p-type impurity.

Next, a semiconductor device manufacturing method according to the embodiment will be described.

In the semiconductor device manufacturing according to the embodiment, a silicon oxide layer containing at least one element selected from the group of phosphorus (P), arsenic (As), antimony (Sb), and bismuth (Bi) is formed on a silicon carbide layer, a first heat treatment is performed in a non-oxidizing atmosphere, a second heat treatment is performed at a temperature lower than a temperature of the first heat treatment in an atmosphere containing ozone, and a third heat treatment is performed in an atmosphere containing hydrogen.

Figure 4:
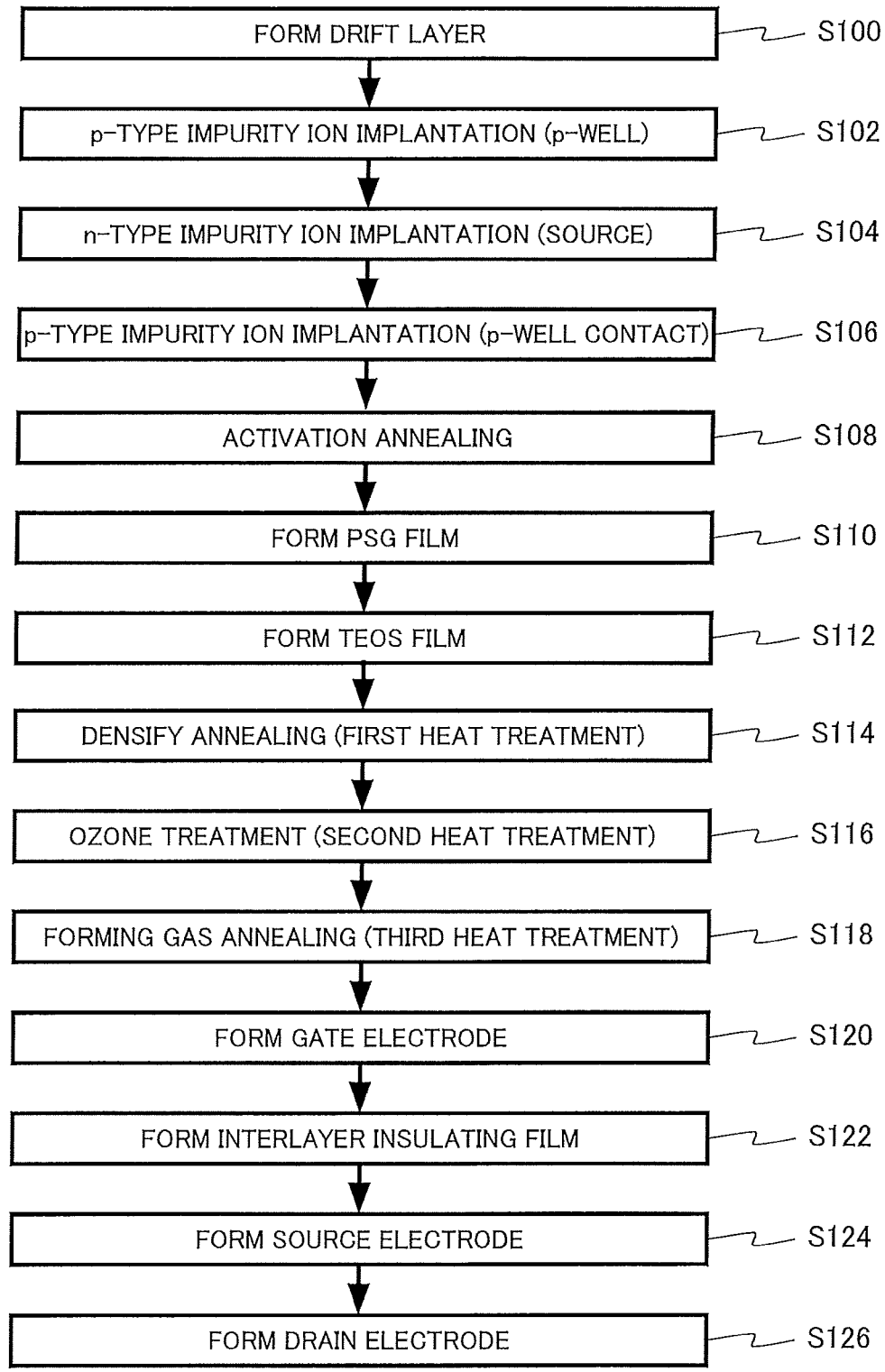
FIG. 4 is a process flowchart of a semiconductor device manufacturing method according to the first embodiment.

FIG. 4 is a process flowchart of the semiconductor device manufacturing method according to the first embodiment.

As illustrated in FIG. 4, the semiconductor device manufacturing method includes: forming a drift layer (step S100); p-type impurity ion implantation (p-well) (step S102); n-type impurity ion implantation (source) (step S104); p-type impurity ion implantation (p-well contact) (step S106); activation annealing (step S108); forming a PSG film (step S110); forming a TEOS film (step S112), densify annealing (first heat treatment) (step S114); ozone treatment (second heat treatment) (step S116); forming gas annealing (third heat treatment) (step S118); forming a gate electrode (step S120); forming an interlayer insulating film (step S122); forming a source electrode (step S124); and forming a drain electrode (step S126).

First, an n$^+$ type silicon carbide substrate 12 is prepared. The silicon carbide substrate 12 is, for example, 4H—SiC. The silicon carbide substrate 12 is, for example, a silicon carbide wafer.

The silicon carbide substrate 12 contains nitrogen as an n-type impurity. An impurity concentration of an n-type impurity of the silicon carbide substrate 12 is, for example, $1 \times 10^{18}$ cm$^{-3}$ or more and $1 \times 10^{20}$ cm$^{-3}$ or less. A thickness of the silicon carbide substrate 12 is, for example, 350 µm. The silicon carbide substrate 12 may be thinned to approximately 90 µm before forming a drain electrode on a back surface.

In step S100, the drift layer 14 is formed on a silicon face of the silicon carbide substrate 12 by an epitaxial growing method. The drift layer 14 is 4H—SiC.

The drift layer 14 contains nitrogen as a n-type impurity. A concentration of the n-type impurity in the drift layer 14 is, for example, $5 \times 10^{15}$ cm$^{-3}$ or more and $2 \times 10^{16}$ cm$^{-3}$ or less. A thickness of the drift layer 14 is, for example, 5 µm or more and 100 µm or less.

In step S102, first, a first mask material is formed by photolithography and patterning by etching. Then, Al, which is a p-type impurity, is ion-implanted into the drift layer 14 by using the first mask material as an ion implantation mask. The p-well region 16 is formed by the ion implantation.

In step S104, first, a second mask material is formed by photolithography and patterning by etching. Nitrogen as an n-type impurity is ion-implanted into the drift layer 14 by using the second mask material as an ion implantation mask to form the source region 18.

In step S106, a third mask material is formed by photolithography and patterning by etching. Aluminum as a p-type impurity is ion-implanted into the drift layer 14 by using the third mask material as an ion implantation mask to form the p-well contact region 20.

In step S108, activation annealing for activating the p-type impurity and the n-type impurity is performed. For example, conditions that argon (Ar) gas is used as an atmospheric gas, a heating temperature is 1750° C., and a heating time is 30 minutes are used for the annealing.

In step S110, a phospho silicate glass (PSG) film is formed on the drift layer 14 and the p-well region 16. The PSG film is a silicon oxide film containing phosphorus. Phosphorus in the PSG film is a termination element.

The PSG film is formed by, for example, a chemical vapor deposition (CVD) method. A film thickness of the PSG film is, for example, 3 nm or more and 10 nm or less.

In step S112, a tetraethyl orthosilicate film (TEOS) is formed on the PSG film. The TEOS film is a silicon oxide film formed by using the TEOS as a source gas. A film thickness of the TEOS film is, for example, 10 nm or more and 100 nm or less.

In step S114, densify annealing (first heat treatment) is performed. The densify annealing is performed in a non-oxidizing atmosphere, for example, in a nitrogen atmosphere. A temperature of the densify annealing is, for example, 900° C. or higher and 1100° C. or lower.

Densities of the PSG film and TEOS film become higher by the densify annealing. Phosphorus (P) in the PSG film substitutes silicon or carbon on surfaces of the drift layer 14 and the p-well region 16 by the densify annealing.

The PSG film and TEOS film after the densify annealing become the silicon oxide layer 28.

In step S116, an ozone treatment (second heat treatment) is performed. The ozone treatment is performed in an atmosphere containing ozone, for example, in an atmosphere containing ozone and nitrogen. A temperature of the ozone treatment is lower than a temperature of the densify annealing. The temperature of the ozone treatment is, for example, 100° C. or higher and 700° C. or lower.

In step S118, forming gas annealing (third heat treatment) is performed. The forming gas annealing is an atmosphere containing hydrogen and nitrogen. A temperature of the forming gas annealing is, for example, 200° C. or higher and 450° C. or lower. A heat treatment may be performed in an atmosphere of 100% hydrogen instead of forming gas.

In step S120, the gate electrode 30 is formed on the silicon oxide layer 28. The gate electrode 30 is, for example, polycrystalline silicon containing an n-type impurity or a p-type impurity.

In step S122, the interlayer insulating film 32 is formed on the gate electrode 30. The interlayer insulating film 32 is, for example, a silicon oxide film.

In step S124, the source electrode 34 is formed. The source electrode 34 is formed on the source region 18 and the p-well contact region 20. The source electrode 34 is formed, for example, by sputtering of nickel (Ni) and aluminum (Al).

In step S126, the drain electrode 36 is formed. The drain electrode 36 is formed on a back surface side of the silicon carbide substrate 12. The drain electrode 36 is formed by, for example, sputtering of nickel.

In step S126, annealing is performed to reduce a contact resistance between the source electrode 34 and the drain electrode 36. The annealing is performed, for example, in an argon gas atmosphere at 400° C. or higher and 1000° C. or lower.

By the above-described manufacturing method, the MOSFET 100 illustrated in FIG. 1 is formed.

Functions and effects according to the present embodiment will be described below.

In the MOSFET 100 according to the embodiment, an interface state is reduced by a termination element substituting silicon or carbon on a surface of a silicon carbide layer. In addition, the termination element diffused in a gate insulating layer is double bonded to oxygen. Consequently, an intra gap state in the gate insulating layer is reduced. Therefore, the MOSFET 100 having high mobility is realized. In addition, MOSFET 100 having a high reliability can be realized with less fluctuation of a threshold voltage. Details will be described below.

In the case of forming a MOSFET by using silicon carbide, there is a problem that carrier mobility is degraded. It is considered that an interface state between the silicon carbide layer and the gate insulating layer and a state in the gate insulating layer cause degradation of the carrier mobility.

Further, when forming a MOSFET by using silicon carbide, there is a problem that threshold voltage fluctuation occurs. In particular, when a silicon oxide layer is used as the gate insulating layer, it is considered that the intra gap state in a band gap of the silicon oxide layer causes the threshold voltage fluctuation.

For example, in a bias temperature instability (BTI) test, a threshold voltage of the MOSFET fluctuates. The BTI test is a test to evaluate characteristic fluctuation by applying an electric field to a gate electrode in a high temperature state. This is considered to be because electric charge moved by the electric field is trapped in a trap level formed by a termination element in the gate insulating layer.

First, an interface state between the silicon carbide layer and the gate insulating layer will be considered. For example, it is considered that electrons traveling in a channel are trapped in the interface state between the silicon carbide layer and the gate insulating layer, and consequently carrier mobility of the MOSFET is degraded.

It is considered that the interface state between the silicon carbide layer and the gate insulating layer is caused by dangling bonds of silicon or carbon in the uppermost layer of the silicon carbide layer.

In the MOSFET 100 according to the embodiment, silicon having dangling bonds or carbon having dangling bonds in the uppermost layers of the drift layer 14 and the p-well region 16 is substituted by a termination element. Therefore, dangling bonds are reduced. Therefore, degradation of carrier mobility of the MOSFET 100 is suppressed.

A part of the termination element introduced to reduce the interface state between the silicon carbide layer and the gate insulating layer also diffuses into the gate insulating layer. To reduce the interface state between the silicon carbide layer and the gate insulating layer, a certain amount or more of the termination elements is required. Excessive termination elements inevitably diffuse into the gate insulating layer. The diffused termination elements form a charge trap level in the gate insulating layer.

Figure 5A:
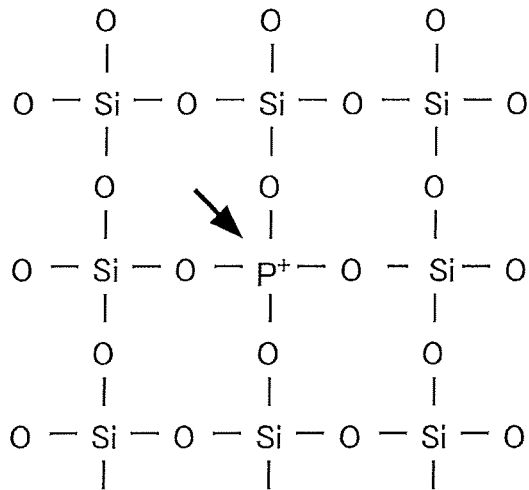
FIGS. 5A, 5B, and 5C are explanatory diagrams of functions and effects according to the first embodiment.
Figure 5B:
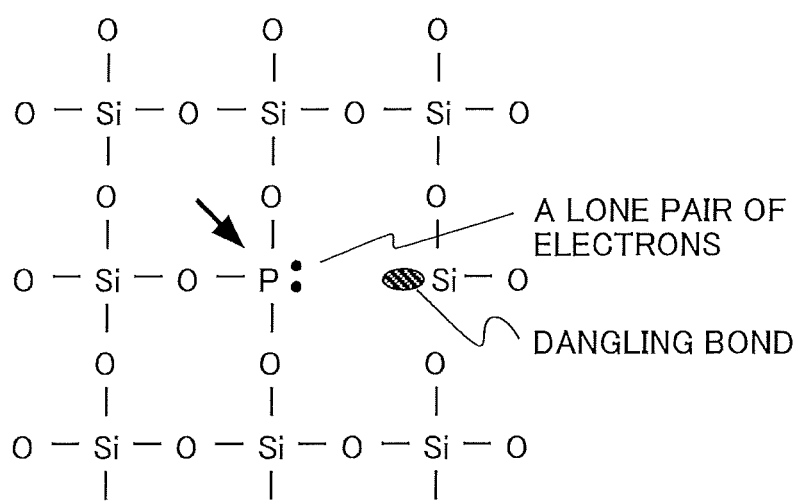
Figure 5C:
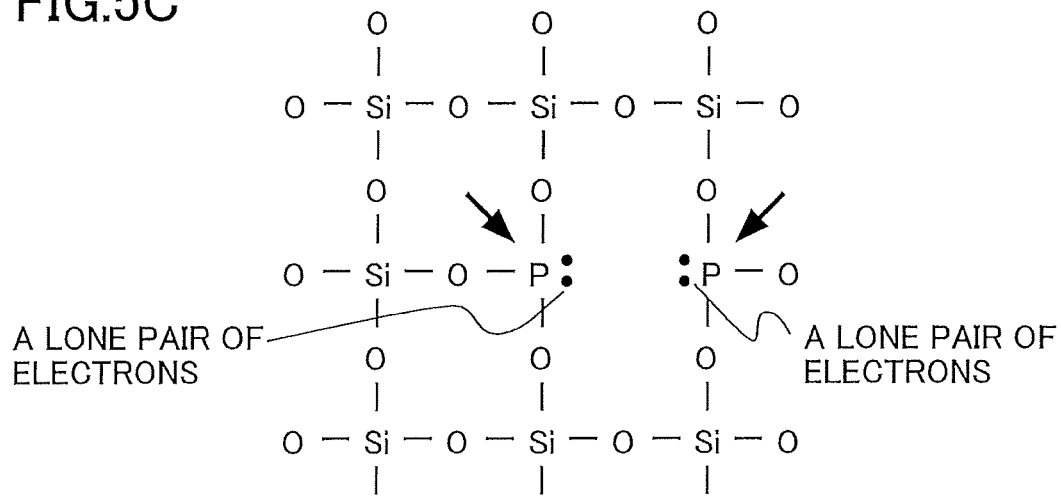

FIGS. 5A, 5B, and 5C are explanatory diagrams of functions and effects according to the embodiment. FIGS. 5A, 5B and 5C are diagrams indicating a bonding state of a termination element in a silicon oxide layer according to a comparative embodiment. In FIGS. 5A, 5B and 5C, the case where the termination element is phosphorus (P) is exemplified.

Phosphorus (P) in the silicon oxide layer substitutes silicon in the silicon oxide layer as indicated by arrows in FIGS. 5A, 5B, and 5C. In other words, phosphorus is positioned at the site of silicon.

In the structure indicated in FIG. 5A, phosphorus emits electrons to form a positive fixed charge. Phosphorus is also a charge trap level.

In the structure indicated in FIG. 5B, phosphorus forms a lone pair of electrons. Phosphorus is a charge trap level. In addition, silicon adjacent to phosphorus forms dangling bonds. Silicon is a charge trap level.

In the structure indicated in FIG. 5C, phosphorus forms a lone pair of electrons. Phosphorus is a charge trap level. Silicon adjacent to phosphorus is also substituted with phosphorus to form a lone pair of electrons, and the silicon is a charge trap level.

In the case where a typical thermal process is performed, phosphorus in the silicon oxide layer has the structures indicated in FIGS. 5A, 5B, and 5C. In particular, the structure indicated in FIG. 5A is most energetically stable.

Therefore, phosphorus in the silicon oxide layer forms a fixed charge or forms a charge trap level. Therefore, mobility of a MOSFET decreases, or a threshold voltage of the MOSFET fluctuates.

In the MOSFET 100 according to the embodiment, phosphorus in the silicon oxide layer 28 is in the bonding state indicated in FIGS. 2A, 2B, and 2C. That is, phosphorus is single bonded to three oxygen atoms and double bonded to one oxygen atom. For this reason, phosphorus is electrically neutral and does not have a lone pair of electrons. Therefore, fixed charges and charge trap levels are not formed in the silicon oxide layer 28. Therefore, the decrease in mobility of the MOSFET is suppressed, and the fluctuation of a threshold voltage of the MOSFET is suppressed.

Figure 6A:
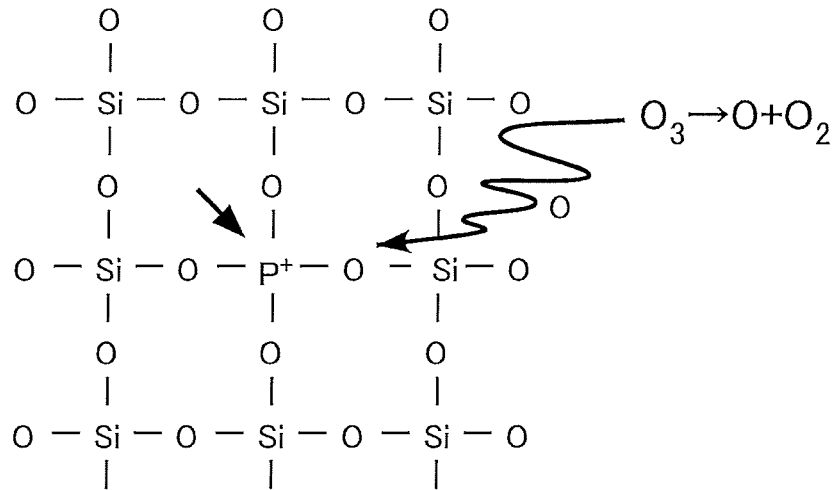
FIGS. 6A, 6B, and 6C are explanatory diagrams of functions and effects according to the first embodiment.
Figure 6B:
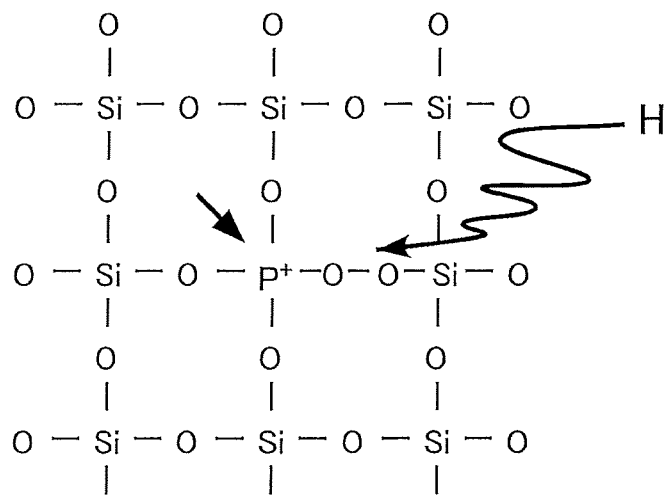
Figure 6C:
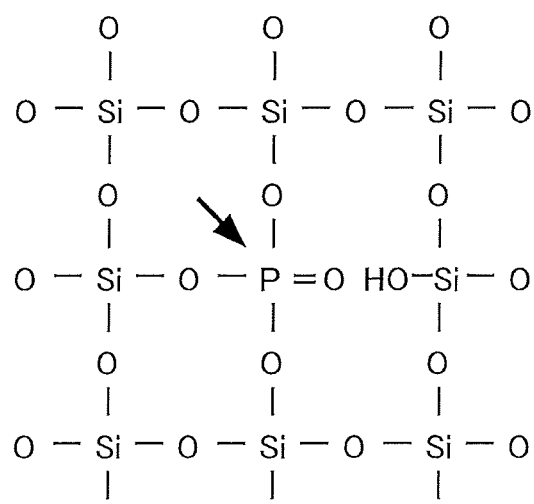
Figure 7A:
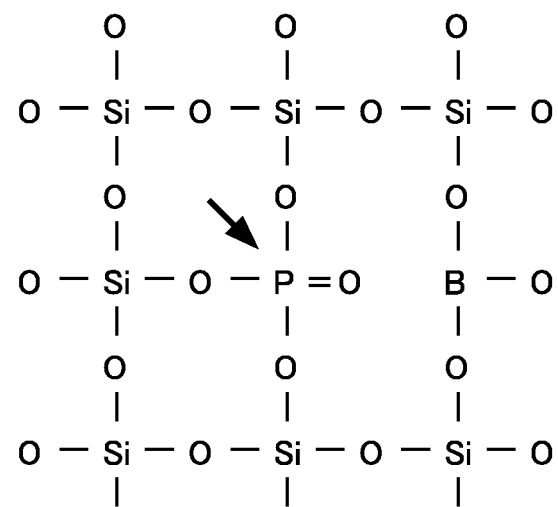
FIG. 7 is an explanatory diagram of a silicon oxide layer according to a second embodiment.
Figure 7B:
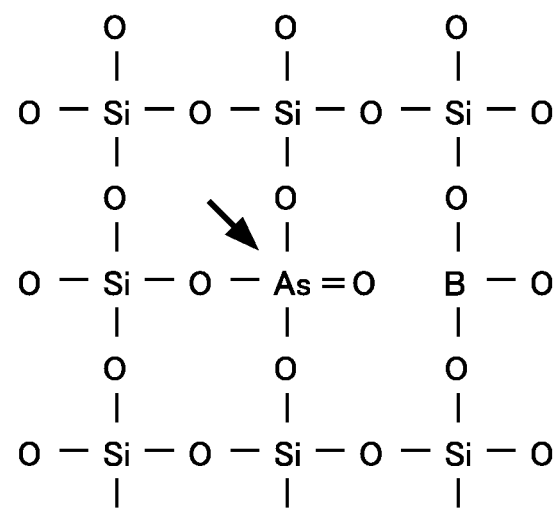
Figure 7C:
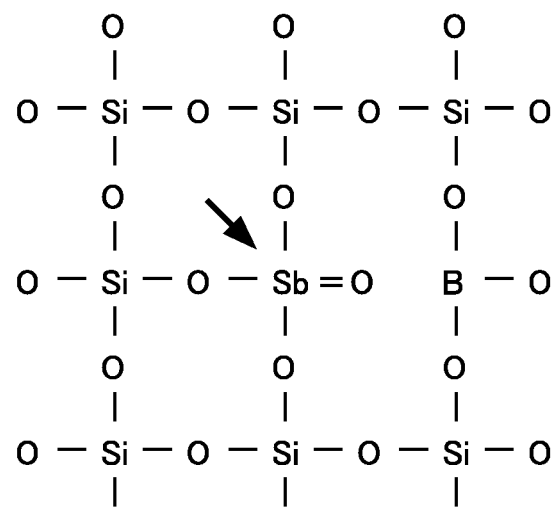
Figure 7D:
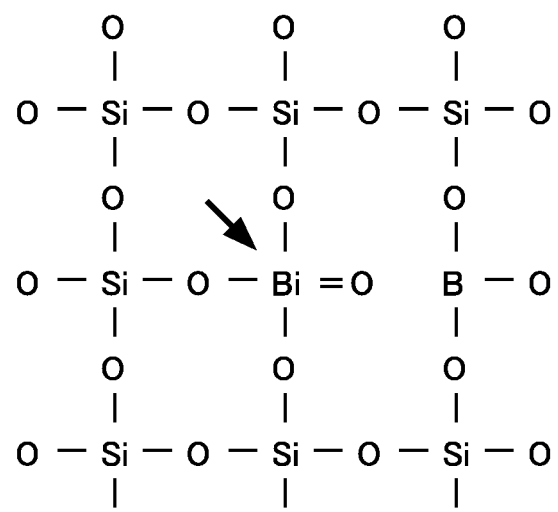

FIGS. 6A, 6B, and 6C are explanatory diagrams of functions and effects according to the embodiment. A process is indicated in which phosphorus in the silicon oxide layer 28 is single bonded to three oxygen atoms and double bonded to one oxygen atom by the manufacturing method according to the embodiment. A transition process of phosphorus in the silicon oxide layer 28 from the structure indicated in FIG. 5A to the structure in FIG. 2A is indicated.

Ozone treatment is performed on the phosphorus-containing silicon oxide layer 28 having the structure indicated in FIG. 6A. Then, oxygen in a high-energy atomic state decomposed from ozone combines with phosphorus to form a structure in which two oxygen atoms are bonded between phosphorus and silicon as illustrated in FIG. 6B. The structure in which two oxygen atoms are bonded between phosphorus and silicon is called a peroxy structure.

Ozone ($O_3$) has a longer diffusion distance in the silicon oxide layer 28 than, for example, oxygen plasma and oxygen radical. Therefore, it is considered that generation efficiency of the peroxy structure is increased.

Forming gas annealing is performed on the phosphorus-containing silicon oxide layer 28 having the structure indicated in FIG. 6B. Then, as illustrated in FIG. 6C, phosphorus and one oxygen atom are double bonded, and oxygen bonded to silicon and hydrogen are combined to form a hydroxyl group.

Phosphorus single bonds to three oxygen atoms and double bonds to one oxygen, and therefore fixed changes and charge trap levels are not formed in the silicon oxide layer 28.

The structure indicated in FIG. 2A is more energetically stable than the structure indicated in FIG. 5A. The structure indicated in FIG. 2A has an energy approximately 3 eV lower than the structure indicated in FIG. 5A.

Similarly, ozone treatment and forming gas annealing cause a transition to the structure indicated in FIG. 2B in the case where phosphorus in the silicon oxide layer 28 has the structure indicated in FIG. 5B. Further, in the case where phosphorus in the silicon oxide layer 28 has the structure indicated in FIG. 5C, the structure transits to the structure indicated in FIG. 2C.

Therefore, phosphorus having any of the structures indicated in FIGS. 5A, 5B, and 5C can be detoxified by the ozone treatment and forming gas annealing.

From the viewpoint of suppressing the decrease in mobility and the fluctuation of a threshold voltage, in termination elements, a proportion occupied by termination elements single bonded to three oxygen atoms and double bonded to one oxygen atom is larger than a proportion occupied by termination elements single bonded to four oxygen atoms. That is, preferably, the number of the termination elements having the structures indicated in FIGS. 2A, 2B, and 2C is larger than the number of the termination elements having the structures having the termination elements having the structure indicated in FIG. 5A.

For example, in the termination elements, a proportion occupied by the termination elements single bonded to three oxygen atoms and double bonded to one oxygen atom is preferably 10 times or more, more preferably 100 times or more, of a proportion occupied by the termination elements single bonded to four oxygen atoms.

From the viewpoint of suppressing the decrease in mobility and the fluctuation of a threshold voltage, in the termination elements, a proportion of the termination elements single bonded to three oxygen atoms and double bonded to one oxygen atom is preferably 90% or more, more preferably 95% or more.

A concentration of the termination element in the silicon oxide layer 28 is, for example, preferably $1\times10^{18}$ cm$^{-3}$ or more and $5\times10^{21}$ cm$^{-3}$ or less, more preferably $1\times10^{19}$ cm$^{-3}$ or more and $1\times10^{21}$ cm$^{-3}$ or less. When the concentration falls below the above-described range, there is a possibility that sufficient termination on an interface cannot be realized, and the decrease in mobility cannot be suppressed. Further, when the concentration exceeds the above-described range, there is a possibility that a termination element cannot be sufficiently detoxified, and the decrease in mobility and the fluctuation of a threshold voltage cannot be suppressed.

The silicon oxide layer 28 contains hydrogen, and the concentration of hydrogen is preferably 80% or more and 120% or less, more preferably 90% or more and 110% or less, of the concentration of the termination element. When the termination element is in the state indicated in FIGS. 2A and 2B, since the silicon oxide layer 28 contains hydrogen, and a ratio of the termination element and hydrogen is 1:1. Therefore, the concentration of the termination element in the silicon oxide layer 28 and the concentrations of hydrogen are substantially the same.

In the embodiment, the case where the PSG film is deposited as a supply source of the termination element has been exemplified. However, instead of the PSG film, a film in which phosphorus is diffused in an atmosphere containing phosphorus oxychloride ($POCl_3$) in a silicon oxide film can be used.

A temperature of density annealing, that is, a temperature of the first heat treatment is preferably 900° C. or higher and 1100° C. or lower. When the temperature falls below the above-described range, there is a possibility that a density of the silicon oxide layer 28 cannot be sufficiently increased. When the temperature exceeds the above-described range, there is a possibility that the termination elements excessively diffuse into a silicon carbide layer or the silicon oxide layer 28.

A temperature during ozone treatment, that is, a temperature of the second heat treatment is preferably 100° C. or higher and 700° C. or lower. When the temperature falls below the above-described range, there is a possibility that detoxification of the termination element in the silicon oxide layer 28 becomes insufficient. In addition, when the temperature exceeds the above-described range, there is a possibility that oxidation of the silicon carbide layer proceeds excessively.

In the embodiment, the case where the termination element is phosphorus (P) has been exemplified. However, even if arsenic (As), antimony (Sb), or bismuth (Bi) is used as the termination element, functions and effects similar to phosphorus can be obtained.

As described above, according to the embodiment, an interface state is terminated by a termination element. In addition, the termination element in the silicon oxide layer 28 is detoxified. Then, a decrease in carrier mobility of the MOSFET 100 is suppressed. Further, fluctuation of a threshold voltage of the MOSFET 100 is suppressed. Therefore, the MOSFET 100 with improved characteristics is realized.

Second Embodiment

A semiconductor device according to a second embodiment is similar to the semiconductor device according to the first embodiment, other than that a silicon oxide layer contains at least one element selected from the group of boron (B), aluminum (Al), gallium (Ga), scandium (Sc), yttrium (Y), lanthanoids (La, Ce, Pr, Nd, Pm, Sm, Eu, Gd, Tb, Dy, Ho, Er, Tm, Yb, Lu). Hereinafter, description of contents already described in the first embodiment will be omitted.

A MOSFET according to the embodiment will be described with reference to FIG. 1. In the MOSFET according to the embodiment, a silicon oxide layer 28 contains at least one element (hereinafter also called an additional element) selected from the group of boron (B), aluminum (Al), gallium (Ga), scandium (Sc), yttrium (Y) and lanthanoids (La, Ce, Pr, Nd, Pm, Sm, Eu, Gd, Tb, Dy, Ho, Er, Tm, Yb, Lu).

FIG. 7 is an explanatory diagram of the silicon oxide layer 28 according to the embodiment. FIG. 7 is a view illustrating a bonding state of the additional element in the silicon oxide layer 28. In FIG. 7A, the case where the termination element is phosphorus (P), and the additional element is boron (B) is exemplified. FIG. 7B, FIG. 7C, and FIG. 7D show the bonding state of As, Sb, and Bi, respectively. As shown in these figures, the As, Sb, and Bi replace the phosphorus (P) in the structures.

Phosphorus, which is a termination element, substitutes silicon, single binds with three oxygen atoms, and double binds with one oxygen atom. On the other hand, boron substitutes silicon and forms a pair with phosphorus double bonded with oxygen.

In the semiconductor device manufacturing method according to the present embodiment, for example, a phospho boro silicate glass (PBSG) film in which boron is added to a PSG film is used instead of the PSG film in the first embodiment.

Figure 8:
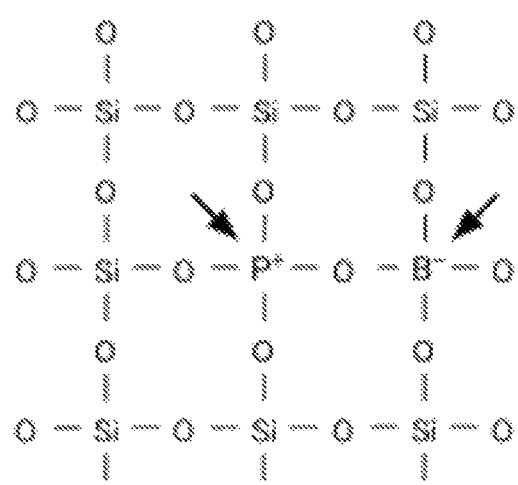
FIG. 8 is an explanatory diagram of functions and effects according to the second embodiment.

FIG. 8 is an explanatory diagram of functions and effects of the semiconductor device according to the present embodiment. FIG. 8 is a diagram indicating a bonding state of a termination element and an additional element in a silicon oxide layer according to a comparative embodiment.

In the structure indicated in FIG. 8, phosphorus emits electrons to form a positive fixed charge. Further, boron absorbs electrons and forms a negative fixed charge. Phosphorus and boron are charge trap levels.

By ozone treatment and forming gas annealing, the structure indicated in FIG. 8 can be the structure indicated in FIG. 7. In the structure indicated in FIG. 7, phosphorus is single bonded to three oxygen atoms and double bonded to one oxygen atom, and therefore phosphorus is electrically neutral. In addition, boron is also in a state of being bonded to three oxygen atoms and is electrically neutral. Therefore, fixed charges and charge trap levels are not formed in the silicon oxide layer 28.

In addition, a PBSG film has a lower melting point and higher fluidity than a PSG film. Therefore, a termination efficiency of an interface by a termination element is improved. In addition, termination of the interface becomes possible at a lower temperature than the PSG film.

If boron is more excessive than phosphorus in the silicon oxide layer 28, excessive boron may forma fixed charge or become a charge trap level. Therefore, a concentration of boron in the silicon oxide layer 28 is preferably lower than a concentration of phosphorus.

In the embodiment, the case where the termination element is phosphorus (P) has been exemplified. However, even if arsenic (As), antimony (Sb), or bismuth (Bi) is used as the termination element, functions and effects similar to phosphorus can be obtained. In addition, although boron (B) has been described as an example of the additional element, functions and effects similar to boron can be obtained in the case of using, as the additional element, aluminum (Al), gallium (Ga), scandium (Sc), yttrium (Y) or lanthanoid (La, Ce, Pr, Nd, Pm, Sm, Eu, Gd, Tb, Dy, Ho, Er, Tm, Yb, Lu).

As described above, according to the embodiment, an interface state is terminated by a termination element. In addition, the termination element in the silicon oxide layer 28 is detoxified. A decrease in carrier mobility of a MOSFET can be suppressed as in the first embodiment or more. In addition, fluctuation of a threshold voltage of the MOSFET is suppressed. Therefore, a MOSFET with improved characteristics is realized.

Third Embodiment

A semiconductor device according to a third embodiment is different from the semiconductor device according to the first embodiment in terms in which a termination region of a MOSFET is provided. Description of contents described in the first embodiment will be omitted.

Figure 9:
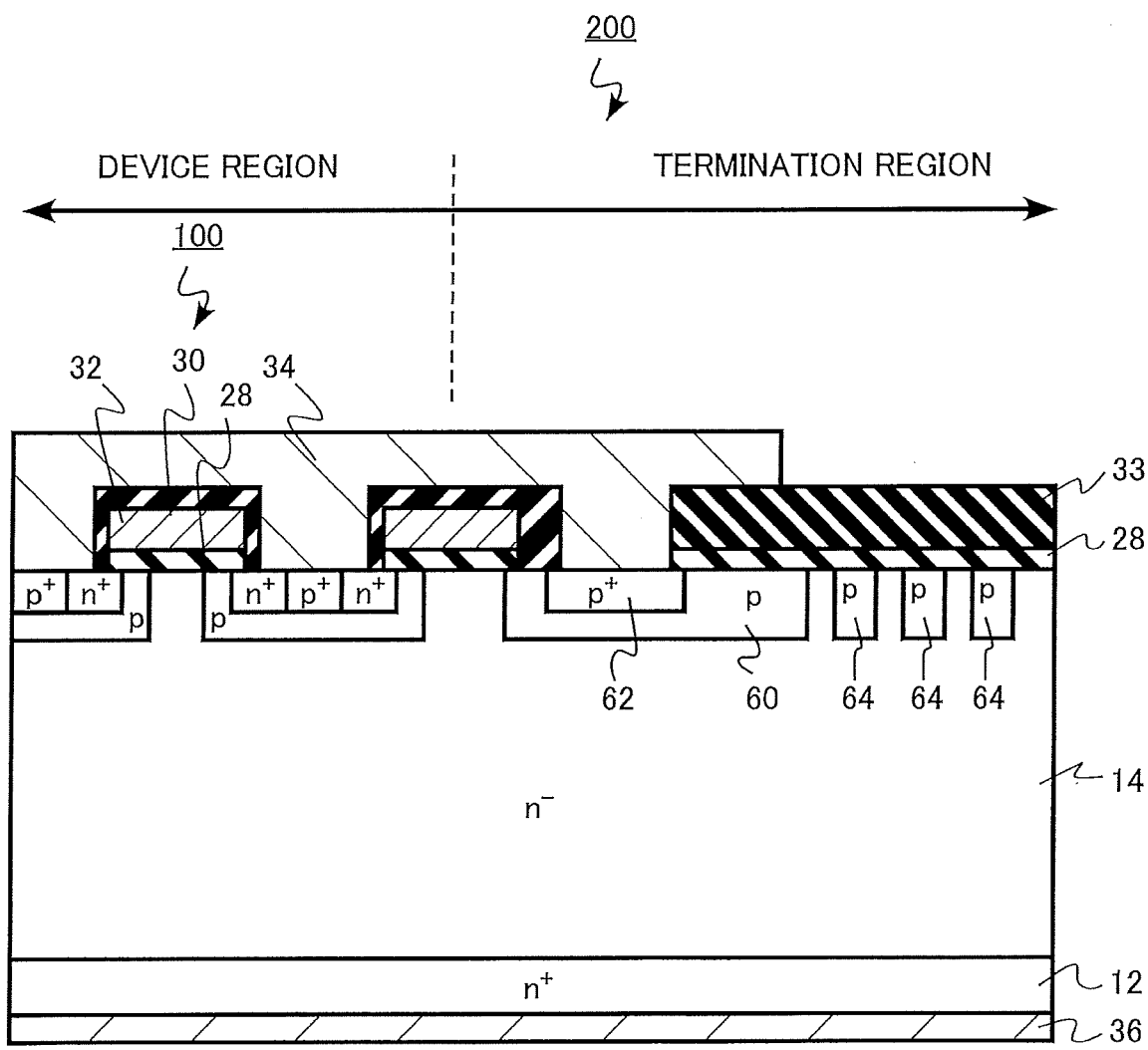
FIG. 9 is a schematic sectional view of a semiconductor device according to a third embodiment.

FIG. 9 is a schematic sectional view illustrating a configuration of a MOSFET which is a semiconductor device according to the present embodiment. A MOSFET 200 includes a device region and a termination region provided around the device region. The termination region includes a function to improve a breakdown voltage of the MOSFET 200.

On the device region, for example, the MOSFET 100 according to the first embodiment is disposed as a unit cell.

The termination region includes a p-type resurf region 60 (silicon carbide layer), a p$^+$-type contact region 62, a p-type guard ring region 64 (silicon carbide layer), a silicon oxide layer 28, and a field oxide film 33. The silicon oxide layer 28 is provided between surfaces of the p-type resurf region 60 and the p-type guard ring region 64 and the field oxide film 33.

A configuration of the silicon oxide layer 28 is the same as the configuration of the first embodiment. The field oxide film 33 is, for example, a silicon oxide film.

When the MOSFET 200 is turned off, a depletion layer is formed on the drift layer 14 (silicon carbide layer) among the resurf region 60, the guard ring region 64, and the guard ring region 64, and a breakdown voltage of the MOSFET 200 is improved.

However, if there is an interface state on an interface between the resurf region 60 and the guard ring region 64 and the field oxide film 33, or there is an intra gap state in the silicon oxide layer 28, a charge is trapped in the interface state or in the intra gap state. By an electric field of the trapped charge, a desired depletion layer may not be formed. In this case, a breakdown voltage of the MOSFET 200 is degraded.

According to the present embodiment, the interface state is terminated by a termination element. In addition, a termination element in the silicon oxide layer 28 is detoxified. Therefore, the MOSFET 200 is realized in which a desired depletion layer is formed, and a breakdown voltage is stabilized.

Fourth Embodiment

An inverter circuit and a driving device according to a fourth embodiment are a driving device including the semiconductor device according to the first embodiment.

Figure 10:
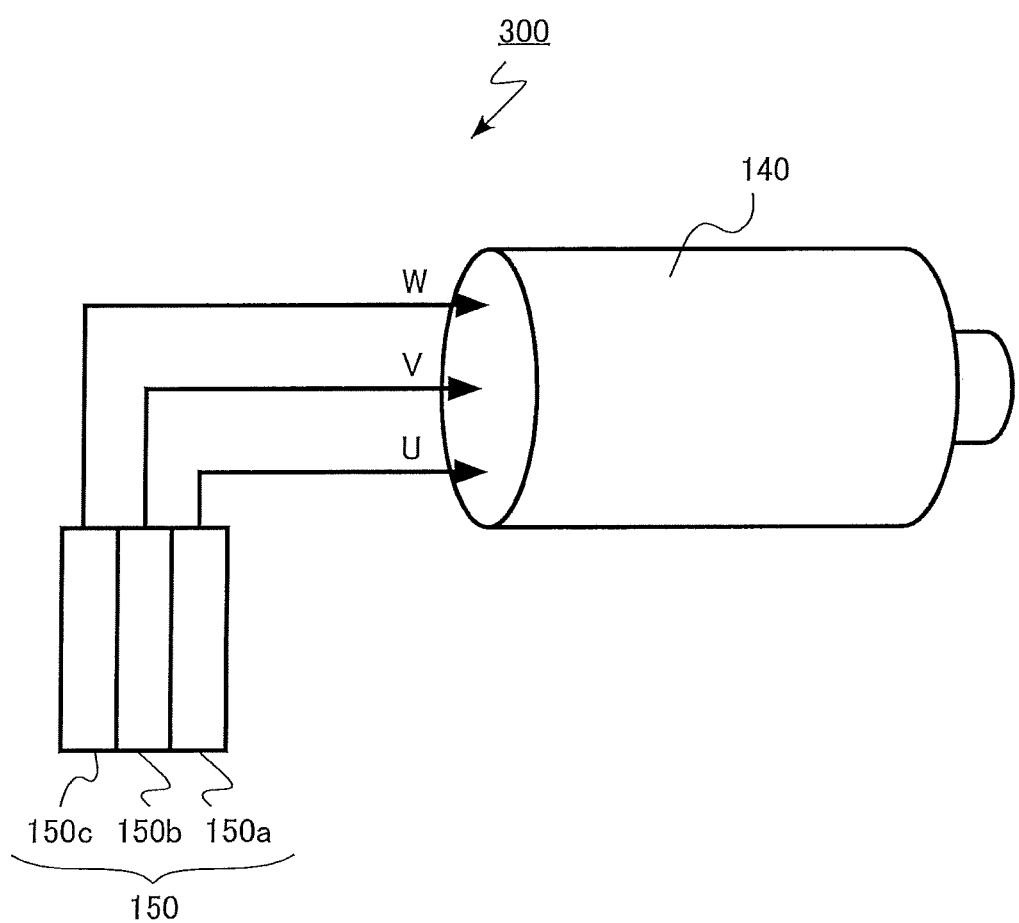
FIG. 10 is a schematic view of a driving device according to a fourth embodiment.

FIG. 10 is a schematic view of the driving device according to the present embodiment. A driving device 300 includes a motor 140 and an inverter circuit 150.

An inverter circuit 150 includes three semiconductor modules 150a, 150b, and 150c in which the MOSFET 100 according to the first embodiment is a switching element. The three semiconductor modules 150a, 150b, and 150c are connected in parallel. Accordingly, a three-phase inverter circuit 150 including three AC voltage output terminals U, V, and W can be realized. The motor 140 is driven by an AC voltage output from the inverter circuit 150.

According to the present embodiment, by providing the MOSFET 100 with improved characteristics, the characteristics of the inverter circuit 150 and the driving device 300 are improved.

Fifth Embodiment

A vehicle according to a fifth embodiment is a vehicle including the semiconductor device according to the first embodiment.

Figure 11:
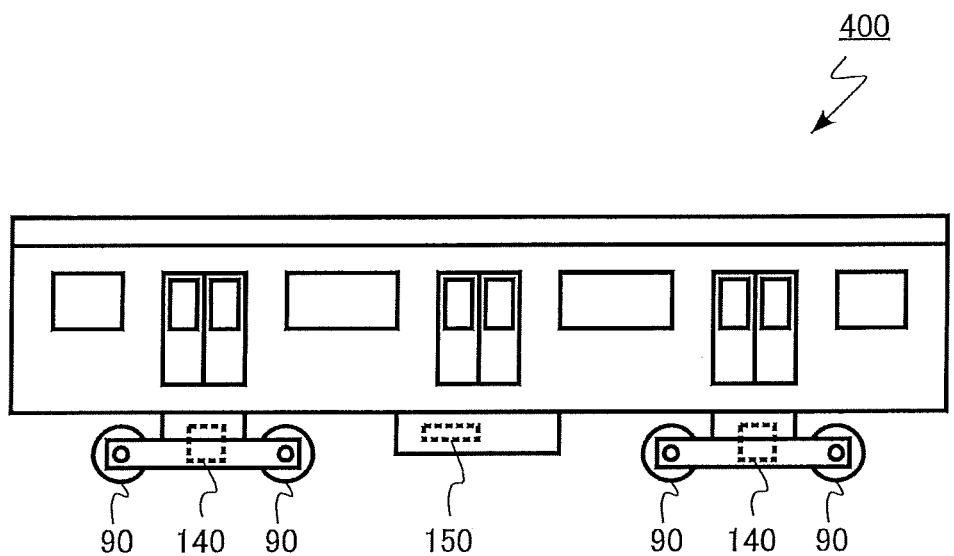
FIG. 11 is a schematic view of a vehicle according to a fifth embodiment.

FIG. 11 is a schematic view of the vehicle according to the present embodiment. A vehicle 400 according to the present embodiment is a railroad vehicle. The vehicle 400 includes a motor 140 and an inverter circuit 150.

The inverter circuit 150 includes three semiconductor modules in which the MOSFET 100 according to the first embodiment is a switching element. The three semiconductor modules are connected in parallel. Accordingly, a three-phase inverter circuit 150 including three AC voltage output terminals U, V, and W is realized. The motor 140 is driven by an AC voltage output from the inverter circuit 150. A wheel 90 of the vehicle 400 is rotated by the motor 140.

According to the present embodiment, by providing the MOSFET 100 with improved characteristics, characteristics of the vehicle 400 are improved.

Sixth Embodiment

A vehicle according to a sixth embodiment is a vehicle including the semiconductor device according to the first embodiment.

Figure 12:
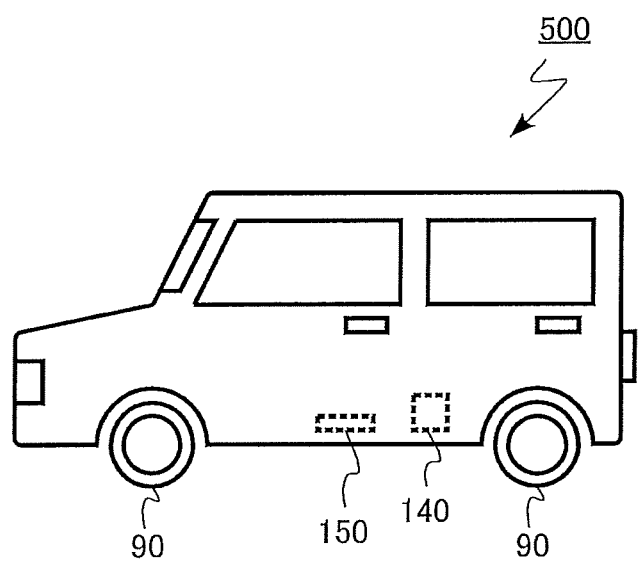
FIG. 12 is a schematic view of a vehicle according to a sixth embodiment.

FIG. 12 is a schematic view of the vehicle according to the present embodiment. A vehicle 500 according to the present embodiment is an automobile. The vehicle 500 includes a motor 140 and an inverter circuit 150.

The inverter circuit 150 includes three semiconductor modules in which the MOSFET 100 according to the first embodiment is a switching element. The three semiconductor modules are connected in parallel. Accordingly, a three-phase inverter circuit 150 including three AC voltage output terminals U, V, and W is realized.

The motor 140 is driven by an AC voltage output from the inverter circuit 150. A wheel 90 of the vehicle 500 is rotated by the motor 140.

According to the present embodiment, by providing the MOSFET 100 with improved characteristics, characteristics of the vehicle 500 are improved.

Seventh Embodiment

An elevator according to a seventh embodiment is an elevator including the semiconductor device according to the first embodiment.

Figure 13:
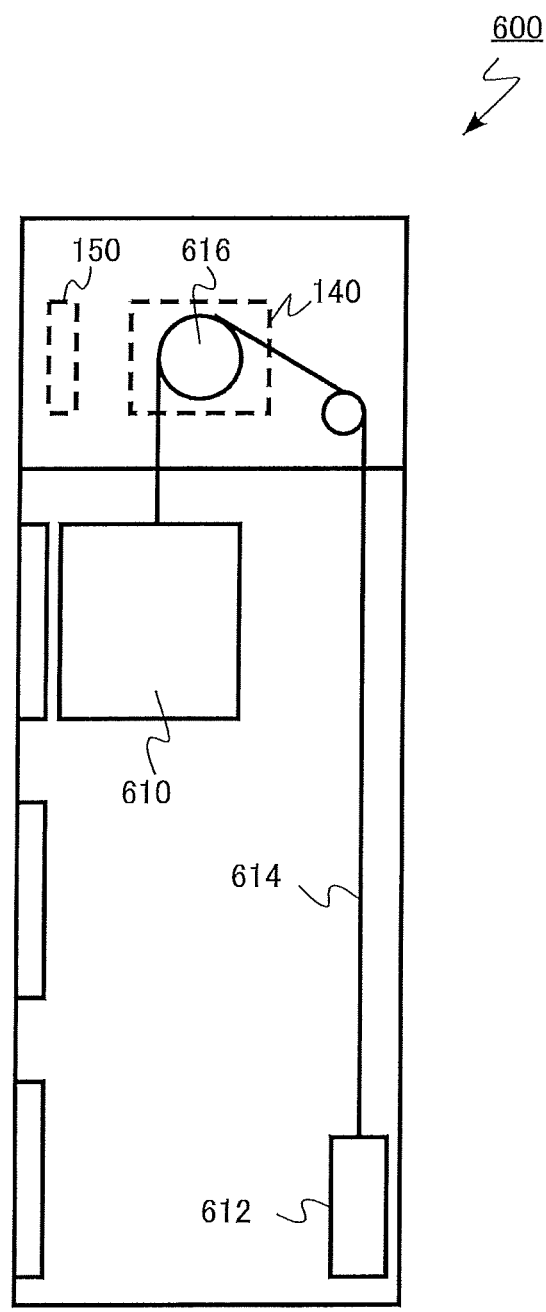
FIG. 13 is a schematic view of an elevator according to a seventh embodiment.

FIG. 13 is a schematic view of an elevator according to the present embodiment. An elevator 600 according to the present embodiment includes an elevator car 610, a counterweight 612, a wire rope 614, a hoisting machine 616, a motor 140, and an inverter circuit 150.

The inverter circuit 150 includes three semiconductor modules in which the MOSFET 100 according to the first embodiment is a switching element. The three semiconductor modules are connected in parallel. Accordingly, a three-phase inverter circuit 150 including three AC voltage output terminals U, V, and W is realized.

The motor 140 is driven by an AC voltage output from the inverter circuit 150. By the motor 140, the hoisting machine 616 rotates, and the elevator car 610 moves up and down.

According to the present embodiment, by providing the MOSFET 100 with improved characteristics, characteristics of the elevator 600 are improved.

In the first to third embodiments, an example in which a crystal structure of silicon carbide is 4H—SiC has been described above. However, the present disclosure can be applied to silicon carbide having other crystal structures such as 6H—SiC and 3C—SiC.

In the first to third embodiments, the case where the silicon oxide layer 28 is provided on a silicon face of silicon carbide has been exemplified. However, the present disclosure can also be applied to the case where the silicon oxide layer 28 is provided on, for example, a carbon face, an a-face, an m-face, and a (0-33-8) face.

Further, in the first embodiment, the example has been described in which a MOSFET is an n-channel type and a planer type. However, the present disclosure can be applied to an n-channel type and a trench type MOSFET. The a-face, them-face, and the (0-33-8) face are representative orientations of a trench side surface. The a-face and the m-face are perpendicular to a Si face and a C face. The (0-33-8) face is a plane inclined by 54.7° in a <1-100> direction with respect to a (0001) face. This crystal face orientation is a crystal face corresponding to Si (001) in Si crystal.

Furthermore, the present disclosure can be applied to an n-channel type insulated gate bipolar transistor (IGBT).

Further, the present disclosure is not limited to the n-channel type and can also be applied to a p-channel type MOSFET or an IGBT.

Further, in the fourth to seventh embodiments, an example has been described in which the semiconductor device according to the present disclosure is applied to a vehicle and an elevator. However, the semiconductor device according to the present disclosure can be applied, for example, to a power conditioner of a solar power generation system.

While certain embodiments have been described, these embodiments have been presented by way of example only, and are not intended to limit the scope of the inventions.

Indeed, a semiconductor device, a semiconductor device manufacturing method, an inverter circuit, a driving device, a vehicle, and an elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a silicon carbide layer;
   a silicon oxide layer containing at least one element selected from the group consisting of phosphorus (P), arsenic (As), antimony (Sb), and bismuth (Bi), at least a part of the at least one element being single bonded to three oxygen atoms and double bonded to one oxygen atom, and the silicon oxide layer further containing a silicon atom bonded to a hydroxyl group, and one of the at least a part of the at least one element and the silicon atom forming a pair structure; and
   a gate electrode, the silicon oxide layer being positioned between the gate electrode and the silicon carbide layer.

2. The semiconductor device according to claim 1, wherein, in the at least one element in the silicon oxide layer, a proportion of the at least one element being single bonded to three oxygen atoms and double bonded to one oxygen atom is larger than a proportion of the at least one element being single bonded to four oxygen atoms.

3. The semiconductor device according to claim 2, wherein, in the at least one element in the silicon oxide layer, the proportion of the at least one element being single bonded to three oxygen atoms and double bonded to one oxygen atom is equal to or greater than ten times of the proportion of the at least one element being single bonded to four oxygen atoms.

4. The semiconductor device according to claim 1, wherein, in the at least one element in the silicon oxide layer, a proportion of the at least one element being single bonded to three oxygen atoms and double bonded to one oxygen atom is 90% or more of the at least one element existing in the silicon oxide layer.

5. The semiconductor device according to claim 1, wherein a concentration of the at least one element is $1 \times 10^{18}$ $cm^{-3}$ or more and $5 \times 10^{21}$ $cm^{-3}$ or less.

6. The semiconductor device according to claim 1, wherein the silicon oxide layer contains hydrogen, and a concentration of hydrogen is 80% or more and 120% or less of a concentration of the plurality of the at least one element.

7. The semiconductor device according to claim 1, wherein a concentration of hydrogen at a first position in a region excluding 10% of the layer thickness of the silicon oxide layer from both end portions in a layer thickness direction is 80% or more and 120% or less of a concentration of the plurality of the at least one element at the first position.

8. The semiconductor device according to claim 1, further comprising a gate electrode, the silicon oxide layer being positioned between the gate electrode and the silicon carbide layer.

9. An inverter circuit, comprising the semiconductor device according to claim 1.

10. A driving device, comprising the semiconductor device according to claim 1.

11. A vehicle comprising the semiconductor device according to claim 1.

12. An elevator comprising the semiconductor device according to claim 1.

13. A semiconductor device, comprising:
    a silicon carbide layer;
    a silicon oxide layer containing at least one element selected from the group consisting of phosphorus (P), arsenic (As), antimony (Sb), and bismuth (Bi), at least a part of the at least one element being single bonded to three oxygen atoms and double bonded to one oxygen atom, the silicon oxide layer further containing at least one other element selected from the group consisting of boron (B), aluminum (Al), gallium (Ga), scandium (Sc), yttrium (Y) and lanthanoids (La, Ce, Pr, Nd, Pm, Sm, Eu, Gd, Tb, Dy, Ho, Er, Tm, Yb, Lu), and one of the at least a part of the at least one element and one of the at least one other element forming a pair structure; and
    a gate electrode, the silicon oxide layer being positioned between the gate electrode and the silicon carbide layer.

14. A semiconductor device, comprising:
    a silicon carbide layer;
    a silicon oxide layer disposed on the silicon carbide layer, the silicon oxide layer containing at least one element selected from the group consisting of arsenic (As) and antimony (Sb), at least a part of the at least one element being single bonded to three oxygen atoms and double bonded to one oxygen atom; and
    a gate electrode, the silicon oxide layer being positioned between the gate electrode and the silicon carbide layer.

15. The semiconductor device according to claim 13, wherein, in the at least one element in the silicon oxide layer, a proportion of the at least one element being single bonded to three oxygen atoms and double bonded to one oxygen atom is larger than a proportion of the at least one element being single bonded to four oxygen atoms.

16. The semiconductor device according to claim 14, wherein, in the at least one element in the silicon oxide layer, a proportion of the at least one element being single bonded to three oxygen atoms and double bonded to one oxygen atom is larger than a proportion of the at least one element being single bonded to four oxygen atoms.

* * * * *